(12) United States Patent
Wilsher

(10) Patent No.: US 11,176,286 B2
(45) Date of Patent: Nov. 16, 2021

(54) SYSTEM AND METHOD FOR INTERNAL STRUCTURAL DEFECT ANALYSIS USING THREE-DIMENSIONAL SENSOR DATA

(71) Applicant: Xerox Corporation, Norwalk, CT (US)

(72) Inventor: Michael J. Wilsher, Herts (GB)

(73) Assignee: Xerox Corporation, Norwalk, CT (US)

( * ) Notice: Subject to any disclaimer, the term of this patent is extended or adjusted under 35 U.S.C. 154(b) by 1067 days.

(21) Appl. No.: 14/848,402

(22) Filed: Sep. 9, 2015

(65) Prior Publication Data
US 2017/0068756 A1 Mar. 9, 2017

(51) Int. Cl.
G06F 17/10 (2006.01)
G06F 30/18 (2020.01)

(52) U.S. Cl.
CPC .................. G06F 30/18 (2020.01)

(58) Field of Classification Search
CPC .............. G06F 17/50; G06F 30/18
USPC .................................................. 703/1
See application file for complete search history.

(56) References Cited

U.S. PATENT DOCUMENTS

| | | | | |
|---|---|---|---|---|
| 6,195,625 B1 * | 2/2001 | Day | ............ | G06F 17/5018 703/1 |
| 6,678,403 B1 * | 1/2004 | Wilk | ............ | G01N 29/0609 382/152 |
| 7,741,961 B1 | 6/2010 | Rafii et al. | | |
| 2009/0248323 A1 * | 10/2009 | Turner | ............ | G01N 29/0654 702/39 |
| 2010/0141755 A1 | 6/2010 | Iwanaga et al. | | |
| 2012/0173184 A1 | 7/2012 | Ovsiannikov et al. | | |
| 2013/0155061 A1 | 6/2013 | Jahanshahi et al. | | |
| 2013/0335528 A1 | 12/2013 | Vishwanath et al. | | |
| 2014/0313324 A1 | 10/2014 | Bienkowski et al. | | |
| 2014/0346094 A1 | 11/2014 | Nygaard | | |

OTHER PUBLICATIONS

Faure et al. "Image-based Collision Detection and Response between Arbitrary Volume Objects" 2008, Eurographics/ACM SIGGRAPH Symposium on Computer Animation, 8 pages.*
Nassiopoulous et al. "Finite element dynamic simulation of whole rallying car structure: Towards better understanding of structural dynamics during side impacts", May 2011, 8$^{th}$ European LS-DYNA Users Conference, 15 pages.*
Kus, Abdil. "Implementation of 3D optical Scanning Technology for Automotive Applications", 2009, Sensors, pp. 1967-1979.*
Scott Page; 3D Laser Scanning: As-Built Reality Capture for BIM; AECbytes Viewpoint; Nov. 29, 2012; 8 Pages; vol. 66; http://www.aecbytes.com/viewpoint/2012/issue_66.html.

* cited by examiner

*Primary Examiner* — Andre Pierre Louis
(74) *Attorney, Agent, or Firm* — Maginot Moore & Beck LLP

(57) ABSTRACT

A method for structural analysis of an object includes generating scanned surface data of an object using a three-dimensional sensor and aligning a physical object model corresponding to the scanned surface data with a predetermined three-dimensional model of the object. The method also includes identifying an interference between a location of the aligned physical object model, optionally including any elastic deformation with an internal component within the three-dimensional model and generating an indicator of expected damage to the internal component.

12 Claims, 6 Drawing Sheets

SYSTEM AND METHOD FOR INTERNAL STRUCTURAL DEFECT ANALYSIS USING THREE-DIMENSIONAL SENSOR DATA

TECHNICAL FIELD

This disclosure relates generally to systems and methods for structural analysis using three-dimensional sensors, and, more particularly, to systems and methods for identifying potential defects in components within an object based on three-dimensional sensor data of the exterior of the object.

BACKGROUND

Repair operations for complex objects, which include vehicles, structures, and industrial equipment, often require a detailed inspection of parts within the object. Frequently, an object that has received damage includes visible exterior damage but the level of damage to components within the object is often difficult to determine without disassembly of the object and manual inspection of the internal components. For example, in some instances, exterior damage to an object is confined to the exterior of the object, such as outer paneling or casing, while in other situations the exterior damage conceals additional damage to one or more components within the object.

Some invasive scanning systems, such as X-ray or magnetic resonance scanners, are known to the art for the detection of damage to internal components within an object without requiring the disassembly of the object. However, the use of intrusive scanners is often impractical in many situations such as motor vehicle repair where a large X-ray scanner is impractical both due to the requirements for radiation shielding and because X-rays often do not penetrate metallic structures that are common to many objects. Thus, structural analysis of many objects requires partial or complete disassembly of the objects to enable manual inspection. Consequently, improvements to structural analysis systems to enable identification of potentially damaged internal components without requiring intrusive sensors or direct manual inspection would be beneficial.

SUMMARY

In one embodiment, a method for structural analysis of an object has been developed. The method includes generating with a three-dimensional sensor surface scan data of an object, generating with a processor a physical object model of a surface of the object with reference to the surface scan data of the object, aligning with the processor the generated physical object model with a surface of a predetermined three-dimensional model of the object in a three-dimensional virtual environment, identifying with the processor an interference between the physical object model aligned with the predetermined three-dimensional model and a volume occupied by an internal component in the predetermined three-dimensional model, the internal component not being present in the sensor surface scan data of the object, and generating with an output device an indicator of expected damage to the internal component within the object in response to the identification of the interference.

In another embodiment, a method for structural analysis of an object has been developed. The method includes generating with a three-dimensional sensor surface scan data of a surface of an object, generating with a processor a physical object model of the surface of the object with reference to the surface scan data of the object, aligning with the processor the physical object model with a surface of a predetermined three-dimensional model of the object in a three-dimensional virtual environment, identifying with the processor a deviation between the physical object model and the surface of the predetermined three-dimensional model, identifying with the processor an estimated physical force applied to the surface of the object to produce the deviation, generating with the processor a simulated result of application of the estimated force to an internal component within the predetermined three-dimensional model, the internal component not being present in the sensor surface scan data of the object, and generating with an output device an indicator of expected damage to the internal component in response to the simulated result of application of the estimated force to the predetermined three-dimensional model exceeding a predetermined operating threshold for the internal component.

In another embodiment, a structural analysis system has been developed. The system includes a three-dimensional sensor configured to generate surface scan data of a surface of an object, an output device, and a processor operatively connected to the three-dimensional sensor, the output device and a memory. The processor is configured to generate the sensor surface scan data of the object with the three-dimensional sensor, generate a physical object model of the surface of the object with reference to the surface scan data of the object, align the physical object model with a surface of a predetermined three-dimensional model of the object stored in the memory in a three-dimensional virtual environment, identify an interference between the physical object model aligned with the predetermined three-dimensional model and a volume occupied by an internal component in the predetermined three-dimensional model, the internal component not being present in the sensor surface scan data of the object, and generate an indicator of expected damage to the internal component within the object in response to the identification of the interference with the output device.

BRIEF DESCRIPTION OF THE DRAWINGS

The foregoing aspects and other features of systems and methods for structural analysis of object are explained in the following description, taken in connection with the accompanying drawings.

DETAILED DESCRIPTION

Figure 1:
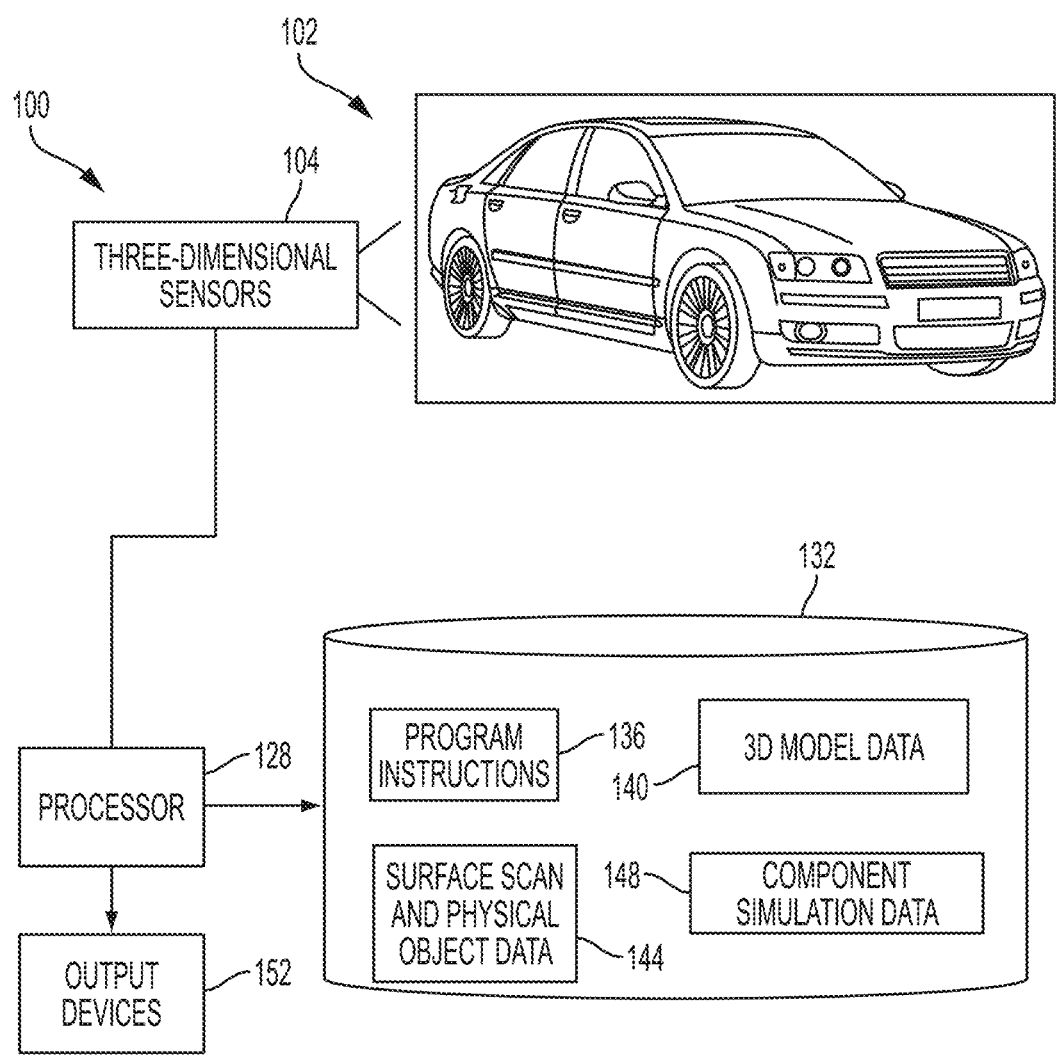
FIG. 1 is a diagram of a structural analysis system.

For a general understanding of the environment for the system and method disclosed herein as well as the details for the system and method, reference is made to the drawings. In the drawings, like reference numerals have been used throughout to designate like elements.

As used herein, the term "three-dimensional virtual environment" refers to a simulated three-dimensional space that includes one or more models of three-dimensional objects. A digital structural analysis system generates the three-dimensional objects with reference to geometric and other physical data that correspond to a real-world physical object. The three-dimensional models include both exterior components of the objects and interior components. Examples of computing hardware and software systems that utilize three-dimensional virtual environments and three-dimensional models include three-dimensional computer aided design (CAD) systems. As described in more detail below, a structural analysis system receives surface scan data that corresponds to a physical instance of an object and aligns the surface scan data with a corresponding three-dimensional model of the object in a three-dimensional object to identify expected damage to internal components within the object.

As used herein, the terms "three-dimensional sensor" or "3D sensor" are used interchangeably and refer to a device that identifies the shape of an exterior of an object in a three-dimensional space. Common examples of three-dimensional sensors include laser detection and ranging (LIDAR) sensors, infrared ranging sensors, millimeter wave radars, stereoscopic camera systems, pattern sensing and time-of-flight sensing systems like Microsoft Kinect, and the like. In digital processing systems, the three-dimensional sensor generates surface scan data that identify different locations on the surface of an object. For example, many three-dimensional sensors generate a "point cloud" that includes a set of three-dimensional coordinates corresponding to each point in a plurality of points that the sensor detects on a surface of an object. A digital structural analysis system uses the point cloud along with interpolation techniques that are known to the art to produce a three-dimensional physical object model of the surface of a physical object in a three-dimensional virtual environment. As used herein, the term "physical object model" refers to a three-dimensional model of all or a portion of the exterior surface of an object that a structural analysis system generates from a surface scan data of the object.

As used herein, the term "surface of an object" refers to any component in an object that is exposed to the three-dimensional sensor during a surface scanning operation. For example, in a motor vehicle a body panel corresponds to a portion of the surface of the motor vehicle. As used herein, the term "internal component" refers to any component underlying the surface of an object that is not directly measured by the three-dimensional sensor when scanning the object. For example, in a motor vehicle a section of the chassis that is positioned behind a body panel is an interior component that is not directly measured by a three-dimensional object sensor.

As used herein, the term "interference" refers to a physical relationship between a surface of an object from a physical object model and an internal component in a predetermined three-dimensional model of an object in which two elements in a three-dimensional model partially overlap within the same volume or are within contact with each other in the three-dimensional virtual environment in a manner that is not part of the design of the predetermined three-dimensional model. An occurrence of interference in a three-dimensional virtual model indicates that two components in a physical object, such as an exterior surface of an object and an internal component within the object, have collided and the internal component may be damaged.

FIG. 1 depicts a structural analysis system 100. The system 100 includes one or more three-dimensional sensors 104 that are operatively connected to a digital processor 128. In many embodiments, the processor 128 further includes multiple digital processing devices, such as one or more central processing unit (CPU) cores, and one or more graphical processing units (GPUs) that are operatively connected to each other to implement the functionality described herein. The processor 128 is also operatively connected to a memory 132 and one or more output devices 152. In the illustrative embodiment of FIG. 1, the structural analysis system 100 generates exterior surface scan data of a motor vehicle 102 to identify expected damage to interior components in the vehicle 102 with reference to deviations in surface scan data of the vehicle 102 compared to a predetermined three-dimensional model of the vehicle 102.

In the system 100, the three-dimensional sensors 104 include one or more LIDARs, RADARs, stereoscopic cameras, or any other suitable sensors that detect the shape of the exterior of an object, such as the motor vehicle 102. In some embodiments the three-dimensional sensors 104 generate multiple sets of surface scan data from different positions around the object 102 to generate surface scan data of all or most of the exterior of the object, while in other embodiments the three-dimensional sensors 104 only generate the scanned surface data for a limited region of interest. For example, if the motor vehicle 102 has received front-end damage during an accident, the three-dimensional sensors 104 generate scanned image data of the region of the front-end that includes the damage and a region around the damaged exterior where the object does not include exterior damage.

In the system 100, the processor 128 includes one or more digital processing devices, including central processing units (CPUs), graphical processing units (GPUs), digital signal processors (DSPs), field programmable gate arrays (FPGAs), application specific integrated circuits (ASICs) and the like that receive surface scan data from the three-dimensional sensors 104. The memory 132 includes both non-volatile data storage devices, such as solid-state and magnetic storage media, and volatile data storage devices such as random access memory (RAM). The processor 128 executes program instructions 136 stored in the memory 132 to run one or more software applications to process the sensor scan data and three-dimensional models of the object 102. The program instructions 136 include, for example, three-dimensional modeling and visualization software that produces a visual representation of the surface scan data and the three-dimensional object models. In some embodiments, the program data also include inventory data to identify particular components in the three-dimensional model of each object.

The memory 132 also stores three-dimensional model data 140 for the object 102 that the three-dimensional sensors 104 scan during operation of the system 100. The three-dimensional model data 140 include a predetermined three-dimensional model of the object that includes both external components, such as body panels on the motor vehicle 102, and internal components for the components within the vehicle 102 that are not directly detected by the three-dimensional surface sensors 104. Examples of predetermined three-dimensional models include three-dimensional schematics for motor vehicles and other multi-component objects that have sufficient precision to be used during manufacture of the object or individual components in the object. Those of skill in the art should recognize that the physical object models described herein are generated with reference to the surface scan data of a physical instance of the object and represent the "real world" shape of the exterior of the object, which may include structural damage or other deviations from the "ideal" shape of the predetermined three-dimensional model data.

Figure 4:
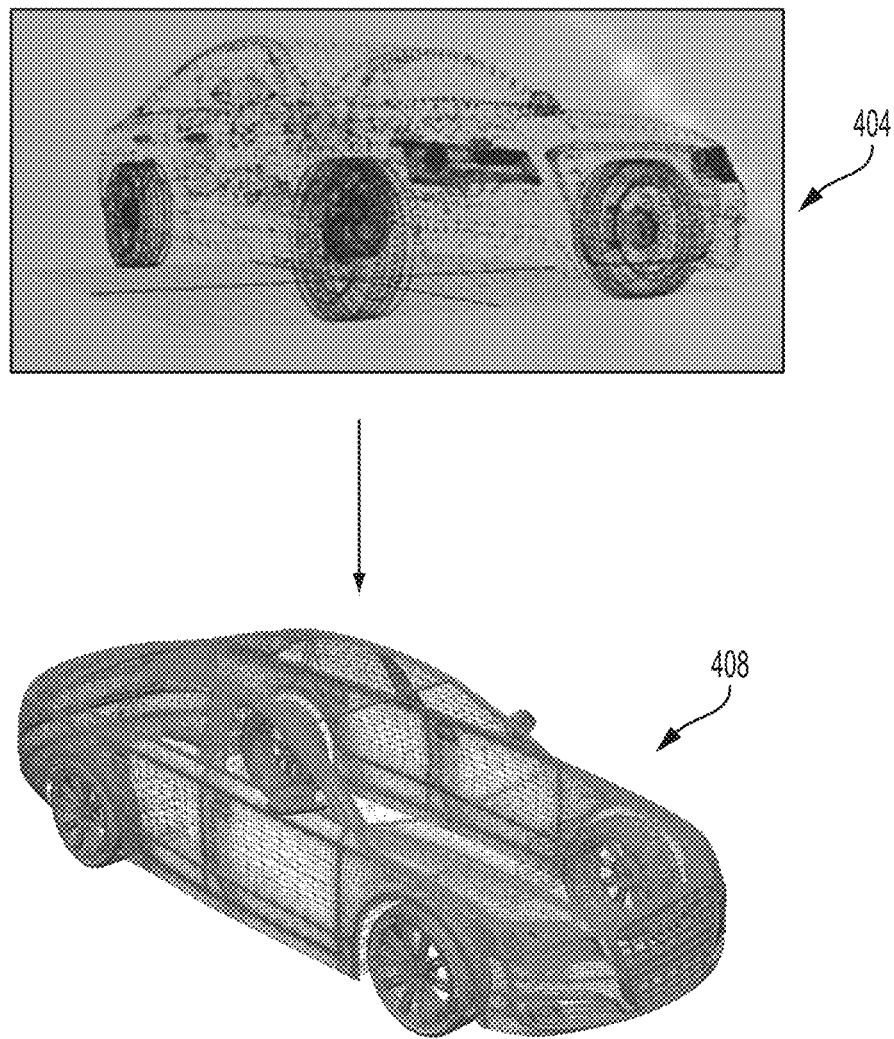
FIG. 4 is a graphical depiction of a point cloud surface scan data and a physical object model that is formed from the point cloud.

The memory 132 also stores surface scan data of the physical object 144 received from the three-dimensional sensors 104. In some embodiments, the three-dimensional sensors 104 generate a "point cloud" of three-dimensional coordinates that correspond to locations of different portions of the exterior surface of the object 102. FIG. 4 depicts an example of a point cloud 404 generated from the exterior of the vehicle 102. The processor 128 performs an interpolation process to generate physical object data 144 for the object 102 that corresponds to the shape of the surface of the object 102. As depicted in FIG. 4, the physical object model 408 includes a three-dimensional geometric mesh that the processor 128 forms from the point cloud data 404 and an interpolation process to generate a three-dimensional model corresponding to the exterior surfaces of the vehicle 102. The geometric mesh includes vertices where at least some of the vertices correspond to points in the point cloud and edges connecting the vertices to form a geometric mesh. In some embodiments, the mesh is formed from a plurality of polygons, such as triangles. The surface scan and physical object data 144 correspond to a three-dimensional shape of the exterior of the object 102. As described in more detail below, in some instances the surface scan and physical object data 144 deviate from the three-dimensional model data 140, such as when the structural analysis system 100 analyzes a motor vehicle that has received damage during an accident.

The memory 132 also stores component simulation data 148. The component simulation data include data that specify the expected physical operational limits for one or more components or structural information that the processor 128 uses to perform a physical simulation of components in the object 102. For example, in one configuration the component simulation data include specifications for multiple components in the object 102, such as the maximum shock and load forces that should be placed on components in the object 102 during operation. As described in more detail below, the processor 128 can detect that the object has been subjected to a level of force that exceeds the physical tolerances of the component. In another configuration, the component simulation data 148 include additional material and structural configuration data beyond the shape and position information for each component in the 3D model data 140. For example, the component simulation data 148 specify the type of material that forms a component in the vehicle. The structural analysis system 100 simulates the response of the component to an external force based on the size and shape of the component in the three-dimensional model data 140 and the type of material that forms the component from the component simulation data 148. The processor 128 generates a physical simulation of the object being subjected to an estimated force using the component simulation data 148 to estimate if one or more internal components in the object have been damaged due to application of the estimated force to an exterior of the object 102.

In the system 100, the output device 152 includes one or more graphical displays that produce an indicator identifying one or more internal components within the object 102 the damage expected from an identified deviation in the shape of the exterior surface of the object 102 from the expected shape for the surface that is stored in the three-dimensional model data 140. In some embodiments, the output device 152 generates an indicator in the form of a graphical depiction of the three-dimensional virtual environment with the object 102 and the expected damage to the interior components within the object 102 using a three-dimensional modeling graphical application. In other embodiments, the output device 152 generates an indicator in the form of a text listing of internal components in the object 102 expected to be damaged including part numbers, stock keeping unit (SKU) numbers and other suitable identifiers.

Figure 2:
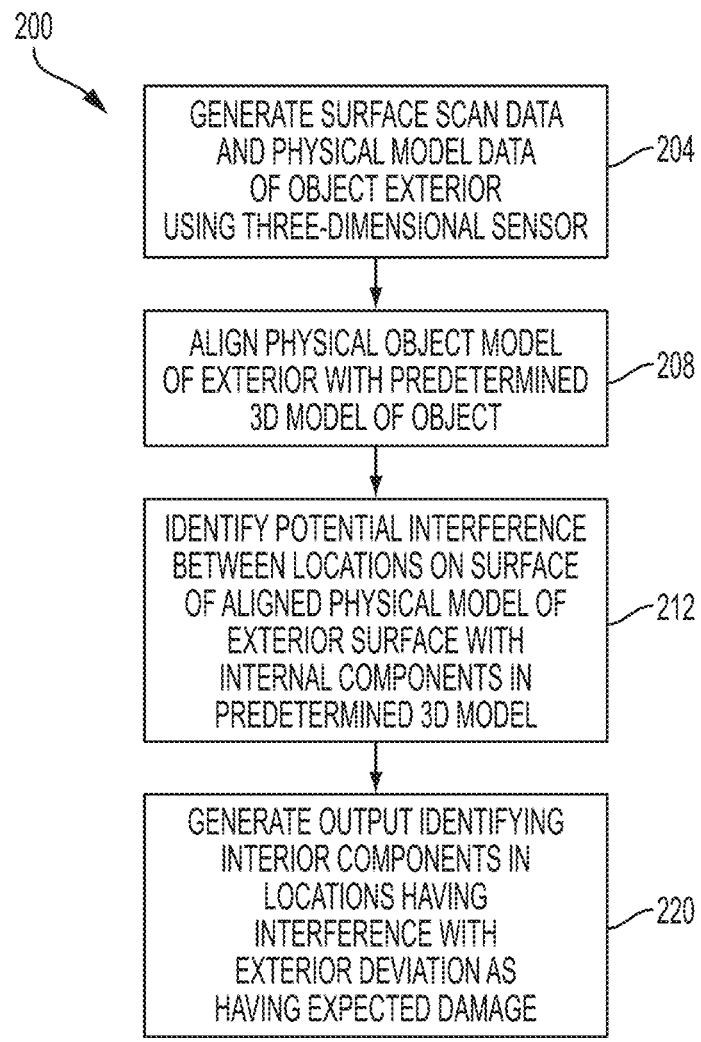
FIG. 2 is a block diagram of a process for operation of a structural analysis system to identify expected damage to internal components within an object based on surface scan data from a surface of the object.

FIG. 2 depicts a block diagram of a process 200 for operation of a structural analysis system. In the description below, a reference to the process 200 performing a function or action refers to the operation of a processor to execute stored program instructions to perform the function or action in association with other components in the structural analysis system. Process 200 is described in conjunction with the system 100 of FIG. 1 for illustrative purposes.

Process 200 begins as the structural analysis system 100 generates surface scan data and physical model data of the exterior of the object 102 using the three-dimensional sensors 104 (block 204). As described above, the three-dimensional sensors 104 in the system 100 generate a point cloud corresponding to three-dimensional coordinates on the surface of the vehicle 102. The processor 128 receives the surface scan point cloud data and generates the physical object model based on the point cloud data as depicted with the point cloud 404 and physical object model 408 of FIG. 4.

Figure 5:
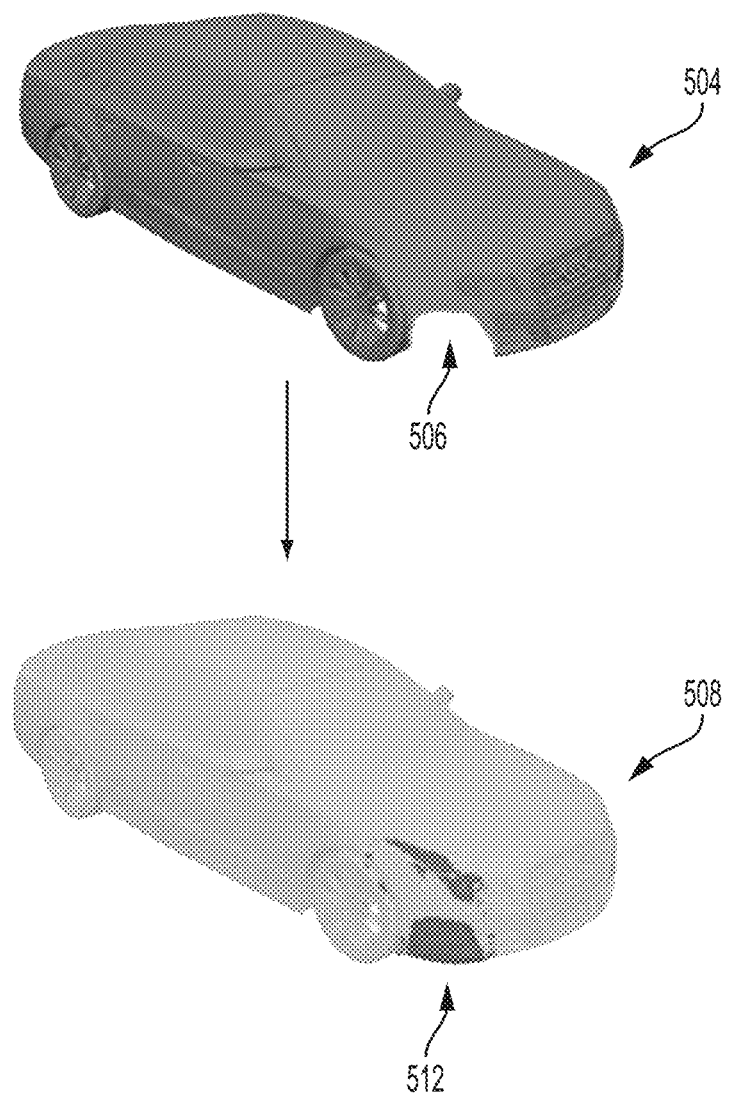
FIG. 5 is a graphical depiction of alignment between a physical object model of an object and a predetermined three-dimensional model of the object where a portion of the surface of the physical object model deviates from a corresponding surface of the predetermined three-dimensional model.

Process 200 continues as the processor 128 aligns the physical model of the exterior surface of the object with the surface of the three-dimensional model (block 208). As described above, the memory 132 stores the three-dimensional model data 140. The processor 128 aligns the physical model with the predetermined three-dimensional model using, for example, at least one registration feature that is common to both the physical model and the predetermined three-dimensional model. For example, in the example of FIG. 1, the side-mirrors on both the physical model of the vehicle based on the scanned sensor data and the three-dimensional model serve as registration features that the processor 128 uses to align the models. The registration features include shapes that the structural analysis system 100 identifies in both models. The system 100 uses one or more of the registration features to align the models in the three-dimensional virtual environment. The structural analysis system 100 selects registration features to serve as common references in regions of the physical object model and the predetermined three-dimensional model that have little or no deviation from the shape of the predetermined three-dimensional model. These selected features correspond to the same feature in the physical object model and the predetermined three-dimensional model. FIG. 5 depicts a physical object model 504 of a motor vehicle that has received front end damage in region 506. This alignment may use these registration features on the two surfaces or manually entered points to aid in the accuracy of the alignment. The alignment of the physical object model with the predetermined three-dimensional model of the vehicle 102 enables the processor 128 to identify regions of potential interference between the exterior and internal components within the vehicle. FIG. 5 depicts areas of potential interference with aligned models 508 and a damage region 506 that depicts locations where the surface of the physical object model deviates from the surface of the predetermined three-dimensional model of the vehicle.

Process 200 continues as the processor 128 identifies potential locations of interference between the surface of the physical model from the three-dimensional sensor scan data and the locations of one or more internal components within the predetermined three-dimensional object (block 212). In one configuration, the processor 128 identifies the locations of vertices in the geometric mesh of the physical object model when aligned with the predetermined model of the object 102. The predetermined three-dimensional model of the object 102 also includes geometric mesh data for each of the internal components and three-dimensional position and orientation data for the internal components in the three-dimensional virtual environment. If any vertices of the physical object model lie within a three-dimensional volume defined by the geometric meshes of any of the internal components within the predetermined three-dimensional model, then the processor 128 identifies a location of interference between the surface of the object and the internal components. The processor 128 optionally identifies interference if the location of the vertex in the geometric mesh for the physical object model is located on or within a predetermined distance of a surface of the geometric mesh model of the internal component in the three-dimensional virtual environment. In another configuration, the processor 128 also identifies the occurrence of interference if any edges between the vertices of the physical object model pass through or are tangential to the volume of the three-dimensional volume in the virtual environment that is occupied by one or more internal components in the predetermined three-dimensional model.

Figure 6:
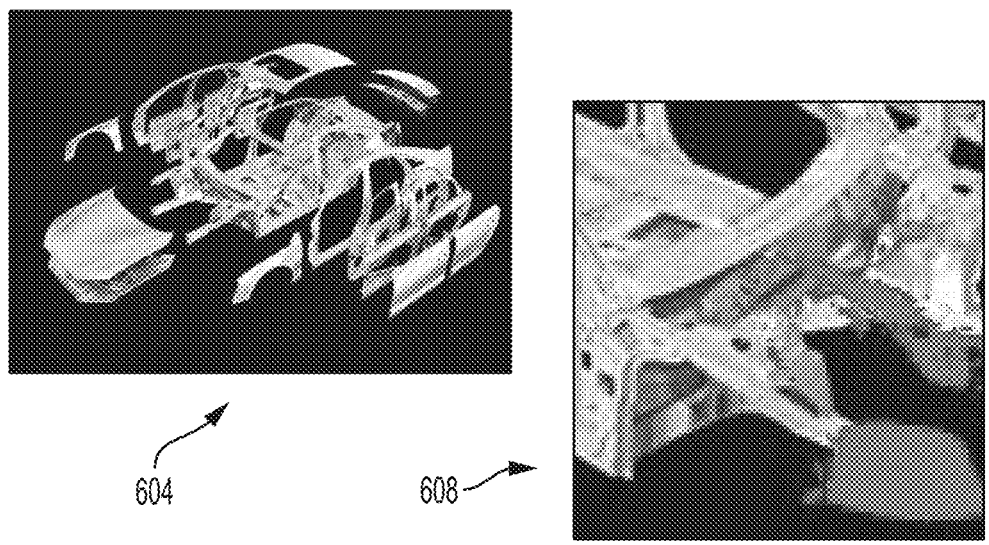
FIG. 6 is a graphical depiction of internal components within a predetermined three-dimensional model of an object and a graphical display of internal components that are potentially damaged due to deviations in the surface of the object identified in surface scan data of the object.

During process 200, the structural analysis system 100 generates an output indicating internal components, if any, that are identified to interfere with the surface of the physical object model (block 220). FIG. 6 depicts an exploded view of the chassis 604 that includes internal components in the three-dimensional model of the vehicle. In one embodiment, the processor 128 generates a graphical display of the locations internal components within the object 102 that interfere with the surface of the physical model. In the system 100, the output device 152 generates the indicator in the form of the graphical display 608 of the three-dimensional virtual environment that indicates the locations of interference between internal components within the vehicle 102 and the surface of the physical object model. In alternative embodiments, the output 152 generates the indicator as a list of internal components that appear to interfere with the surface of the physical object model. In other situations in which the surface of the physical object model does not interfere with the internal components in the predetermined object model, the system 100 generates another indicator to indicate that any deviations in the exterior surface of the object 102 do not appear to interfere with internal components. The indicator produced by the structural analysis system 100 enables technicians to identify and repair damage to the vehicle in an efficient manner.

Figure 3:
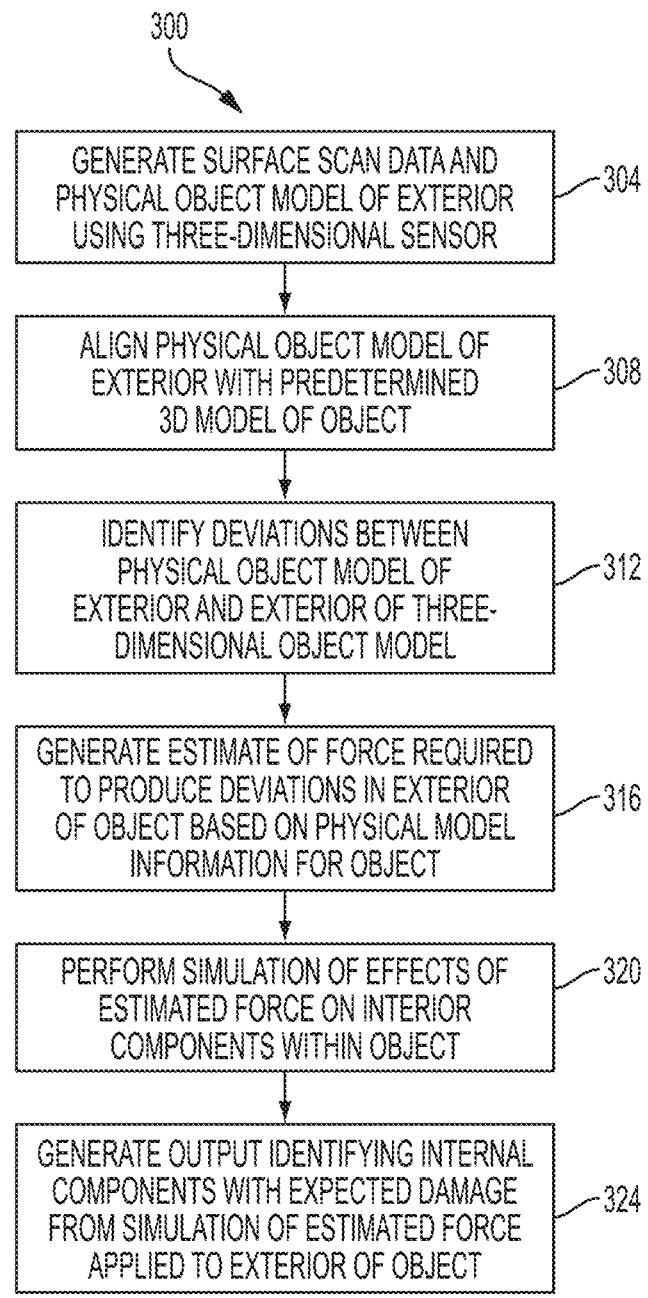
FIG. 3 is a block diagram of another process for operation of a structural analysis system to identify expected damage to internal components within an object based on surface scan data from a surface of the object.

FIG. 3 depicts a block diagram of another process 300 for operation of a structural analysis system. In the description below, a reference to the process 300 performing a function or action refers to the operation of a processor to execute stored program instructions to perform the function or action in association with other components in the structural analysis system. Process 300 is described in conjunction with the system 100 of FIG. 1 for illustrative purposes.

Process 300 begins as the analysis system 100 generates three-dimensional surface scan data of the exterior surface of an object and produces a physical object model for the object (block 304). The system 100 performs the processing of block 304 in a similar manner to the processing of block 204 that is described above. Process 300 continues as the analysis system 100 aligns the physical object model of the exterior of the object based on the scanned sensor data with a predetermined three-dimensional model of the object (block 308). The system 100 performs the processing of block 308 in a similar manner to the processing of block 208 that is described above.

Process 300 continues as the processor 128 identifies deviations between the physical object model of the exterior of the object and the exterior surface of the predetermined three-dimensional model (block 312). In one embodiment, the processor 128 identifies deviations in the physical object model for the object 102 for any vertices in the physical object model that are located beyond a predetermined tolerance range from the surface of the three-dimensional object model. For example, the system 100 generates an estimate of the force required to plastically deform the surface includes estimation of elastic deformation using Finite Element Analysis (FEM) based on the surface scan data and the types of materials that form structures in the object stored in the component simulation data 148. The system 100 performs the FEM process to identify potential damage to elastic and semi-elastic components within the object 102, which can be deformed into internal structures damaging then but then partly spring back and not collide in the static condition. In another embodiment, the system 100 executes a CAD program to extract a shape using a geometric part comparison operation to identify the differences in shape between the surfaces of components in the scanned image data and the predetermined three-dimensional model data 140 to identify deviations between the expected shape of the component and the actual shape of the component.

During process 300, the structural analysis system 100 generates an estimation of a level of physical force that is required to produce the identified deviation in the surface of the physical object model from the predetermined three-dimensional model of the object (block 316). In one embodiment the processor 128 identifies the level of force as a predetermined function of the magnitude of measured deviation in the surface of the object. For example, a vehicle that is subjected to different crash tests at predetermined velocity and force levels receives different levels of damage that produce different deviations in the exterior of the vehicle. In one embodiment, the processor 128 accesses a database of empirical crash test data to generate an estimate of the force required to produce the deviations in the exterior of the vehicle from the previously generated crash test data. In the system 100, the component simulation data 148 optionally includes the database of empirical physical data corresponding to forces that produce given levels of damage and corresponding deviations in the exterior shape of the object 102. In another embodiment, the processor 128 performs iterative physical simulations with the three-dimensional object model of the object 102 and the component simulation data 148 stored in the memory 132 to generate simulated damage to the exterior of the object 102. The processor 128 identifies a level of physical force that produces damage with an exterior deviation in the shape of the object that approximates the actual scanned surface data for the physical object model to generate an estimate of the level of force that produces the measured deviation in the physical object model.

Process 300 continues as the structural analysis system 100 performs a simulation of the effects of the estimated force that produced the deviations in the exterior of the object on internal components within the object (block 320). For example, in the system 100 the processor 128 uses the three-dimensional object model data 140 and the component simulation data 148 for the object 102 to perform a simulation of the estimated force that the object received. The simulation further includes an application of the force at a particular direction and location on the object where the surface of the physical object model deviates from the surface of the three-dimensional object model. Using the example that is depicted in FIG. 5, the processor 128 applies the estimated force for a front end-collision to the region 512 on the aligned physical object model and predetermined three-dimensional model to simulate the effects of an impact on the vehicle. In particular, the simulation models the forces received by internal components that are proximate to the location of the force that produces the deviation in the exterior of the physical object model, which have a greater likelihood of being damaged. The simulation also models the attenuation of force applied to internal components that are more remote from the location of the deviation in the exterior of the physical object model to provide more accurate estimates of the potential to damage of internal components at different locations within the object.

In another embodiment, the processor 128 omits a detailed physical simulation of the impact force on the predetermined three-dimensional model of the object. Instead, the processor 128 performs a simplified simulation to identify the maximum operational force thresholds for internal components that are stored with the component simulation data 148. The processor 128 identifies any internal components within a predetermined radius of the location of the deviation in the exterior surface of the physical object model that have a maximum operating force threshold below the estimated force level as potentially being damaged.

After performing the simulation, the processor 128 generates an output that identifies one or more of the internal components with expected damage (block 324). As described above in conjunction with the process 200, the system 100 generates an indicator with the output device 152 that includes either a graphical depiction of a three-dimensional virtual environment with the internal components expected to be damaged within the three-dimensional model of the object 102 or a list of component identifiers expected to be damaged to assist in inspecting and repairing any damaged internal components.

In some embodiments, the structural analysis system 100 performs one or both of the processes 200 and 300 to identify internal components that may be damaged based on the measured surface scan data of the exterior of an object. While the embodiments described herein are directed to a structural analysis of a motor vehicle, the foregoing embodiments are not limited to motor vehicles but are applicable to a wide range of objects. Examples of objects that are suitable for analysis using the foregoing embodiments include, but are not limited to, aircraft, ships, industrial machinery, buildings, bridges, roads, and the like.

It will be appreciated that variants of the above-disclosed and other features, and functions, or alternatives thereof, may be desirably combined into many other different systems or applications. Various presently unforeseen or unanticipated alternatives, modifications, variations, or improvements therein may be subsequently made by those skilled in the art, which are also intended to be encompassed by the following claims.

What is claimed is:

1. A method for structural analysis comprising:
generating with a three-dimensional sensor surface scan data of an exterior surface of an object;
generating with a processor a physical object model of the exterior surface of the object with reference to the surface scan data of the object;
aligning with the processor a first portion of the generated physical object model that corresponds to a first feature on the exterior surface of the object with the first feature on a surface of a predetermined three-dimensional model of the object in a three-dimensional virtual environment;
identifying with the processor an interference between a second portion of the physical object model that corresponds to a damaged region of the exterior surface of the object that deviates from the surface of the predetermined three-dimensional model and a volume occupied by an internal component in the predetermined three-dimensional model, the internal component not being present in the sensor surface scan data of the exterior surface of the object; and
generating with an output device an indicator of expected damage to an internal component within the object that corresponds to the internal component in the predetermined three-dimensional model in response to the identification of the interference.

2. The method of claim 1, the generation of the surface scan data and physical object model further comprising:
generating with the three-dimensional sensor a point cloud including a plurality of three-dimensional coordinates corresponding to a plurality of locations on the exterior surface of the object; and
generating with the processor the physical object model including a geometric mesh corresponding to the exterior surface of the object with reference to the point cloud.

3. The method of claim 2, the identification of the interference further comprising:
identifying with the processor a location of a vertex in the geometric mesh in the second portion of the physical object model;
identifying with the processor a volume within the three-dimensional virtual environment for the internal component with reference to another geometric mesh corresponding to the internal component; and
identifying with the processor the interference between the physical object model and the internal component in response to the location of the vertex in the physical object model being within the volume of the internal component.

4. The method of claim 2, the identification of the interference further comprising:
identifying with the processor a location of a vertex in the geometric mesh in the second portion of the physical object model;
identifying with the processor a surface of the internal component in the three-dimensional virtual environment with reference to another geometric mesh corresponding to the internal component; and
identifying with the processor the interference between the physical object model and the internal component in response to the location of the vertex in the physical object model being on or within a predetermined distance of the surface of the internal component.

5. The method of claim 1, the generation of the indicator further comprising:
generating with the output device a graphical depiction of the object and the internal component in the three-dimensional virtual environment.

6. The method of claim 1, the generation of the surface scan data further comprising:
generating with the three-dimensional sensor the surface scan data of an exterior surface of a motor vehicle.

7. A structural analysis system comprising:
a three-dimensional sensor configured to generate surface scan data of an exterior surface of an object;
an output device; and
a processor operatively connected to the three-dimensional sensor, the output device and a memory, the processor being configured to:
generate the sensor surface scan data of the object with the three-dimensional sensor;
generate a physical object model of the exterior surface of the object with reference to the surface scan data of the object;
align a first portion of the physical object model that corresponds to a first feature on the exterior surface of the object with the first feature on a surface of a predetermined three-dimensional model of the object stored in the memory in a three-dimensional virtual environment;
identify an interference between a second portion of the physical object model that corresponds to a damaged region of the exterior surface of the object that deviates from the surface of the predetermined three-dimensional model and a volume occupied by an internal component in the predetermined three-dimensional model, the internal component not being present in the sensor surface scan data of the exterior surface of the object; and
generate an indicator of expected damage to the internal component within the object that corresponds to the internal component in the predetermined three-dimensional model in response to the identification of the interference with the output device.

8. The system of claim 7, the processor being further configured to:
generate with the three-dimensional sensor a point cloud including a plurality of three-dimensional coordinates corresponding to a plurality of locations on the exterior surface of the object; and
generate the physical object model including a geometric mesh corresponding to the exterior surface of the object with reference to the point cloud.

9. The system of claim 8, the processor being further configured to:
identify a location of a vertex in the geometric mesh in the second portion of the physical object model;
identify a volume within the three-dimensional virtual environment for the internal component with reference to another geometric mesh stored in the memory corresponding to the internal component; and
identify the interference between the physical object model and the internal component in response to the location of the vertex in the physical object model being within the volume of the internal component.

10. The system of claim 8, the processor being further configured to:
identify with the processor a location of a vertex in the geometric mesh in the second portion of the physical object model;
identify with the processor a surface of the internal component in the three-dimensional virtual environment with reference to another geometric mesh corresponding to the internal component; and
identify with the processor the interference between the physical object model and the internal component in response to the location of the vertex in the physical object model being on or within a predetermined distance of the surface of the internal component.

11. The system of claim 7, the output device being further configured to:
generate the indicator as a graphical depiction of the object and the internal component in the three-dimensional virtual environment with the output device.

12. The system of claim 7, the processor being further configured to: generate the surface scan data of an exterior surface of a motor vehicle with the three-dimensional sensor.

* * * * *